(12) United States Patent
Faneuf et al.

(10) Patent No.: US 6,643,132 B2
(45) Date of Patent: Nov. 4, 2003

(54) CHASSIS-LEVEL THERMAL INTERFACE COMPONENT FOR TRANSFER OF HEAT FROM AN ELECTRONIC COMPONENT OF A COMPUTER SYSTEM

(75) Inventors: Barrett M. Faneuf, Lakewood, WA (US); David S. De Lorenzo, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/039,003

(22) Filed: Jan. 4, 2002

(65) Prior Publication Data
US 2003/0128515 A1 Jul. 10, 2003

(51) Int. Cl.[7] .................................................. H05K 7/20
(52) U.S. Cl. .................. 361/700; 165/104.33; 165/80.4; 174/15.2; 257/715; 361/695; 361/704; 361/699; 361/831; 361/687
(58) Field of Search .............................. 165/80.2, 80.3, 165/80.4, 185, 104.33; 174/15.1, 15.2, 16.1, 16.3; 257/714–715; 361/687–710, 725–727, 814, 831; 714/10

(56) References Cited

U.S. PATENT DOCUMENTS

| | | | |
|---|---|---|---|
| 4,867,235 A | * | 9/1989 | Grapes et al. ............... 165/185 |
| 5,289,694 A | * | 3/1994 | Nordin ................... 165/104.33 |
| 5,731,954 A | | 3/1998 | Cheon |
| 6,021,049 A | | 2/2000 | Thompson et al. |
| 6,118,654 A | * | 9/2000 | Bhatia ......................... 361/687 |
| 6,141,211 A | * | 10/2000 | Strickler et al. ............ 361/685 |
| 6,166,907 A | * | 12/2000 | Chien .......................... 361/699 |
| 6,337,794 B1 | | 1/2002 | Agonafer et al. |
| 6,351,381 B1 | | 2/2002 | Bilski et al. |
| 6,366,461 B1 | | 4/2002 | Pautsch et al. |
| 6,496,364 B1 | | 12/2002 | Medin et al. |
| 2002/0149909 A1 | | 10/2002 | Konstad et al. |

* cited by examiner

Primary Examiner—Gregory Thompson
(74) Attorney, Agent, or Firm—Blakely, Sokoloff, Taylor & Zafman LLP

(57) ABSTRACT

A computer system is described of the kind having a frame and a plurality of server unit subassemblies that are insertable into the frame. Each server unit subassembly has a chassis component which engages with a frame component on the frame. Heat can transfer from the chassis component to the frame component, but the server unit subassembly can still be moved out of the frame. In one embodiment, an air duct is located over a plurality of the frame components. Heat transfers from the frame components to air flowing through the duct. A modified capillary pumped loop is used to transfer heat from a processor of the server unit subassembly to thermal components on the frame.

9 Claims, 10 Drawing Sheets

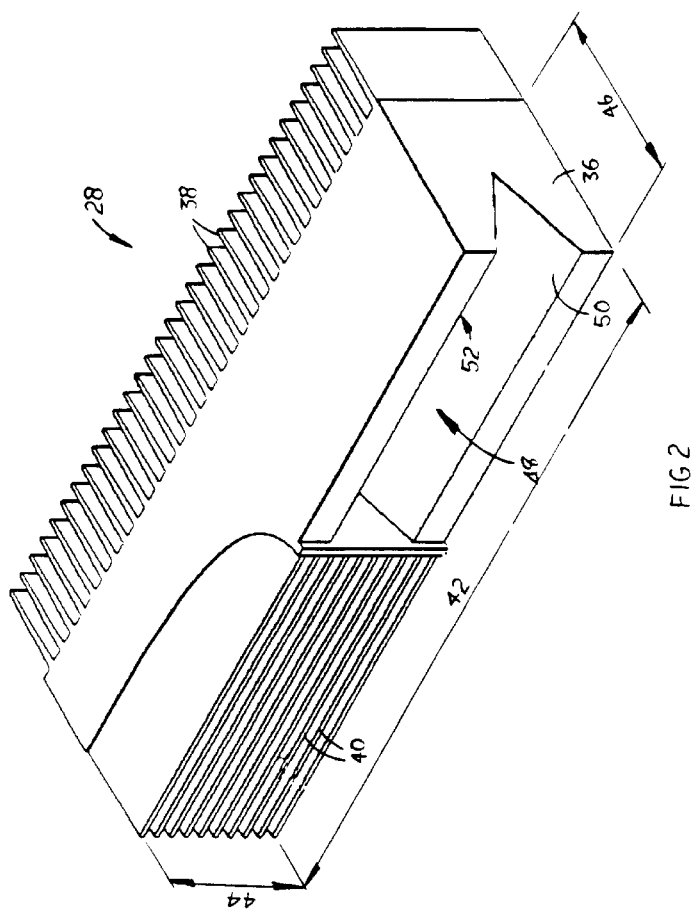
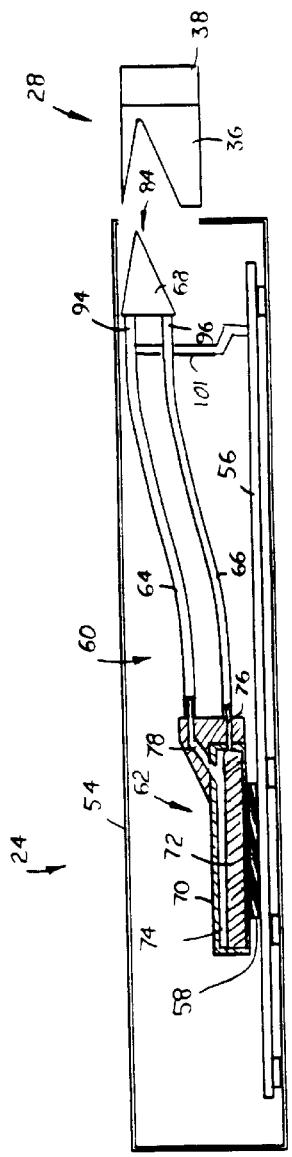

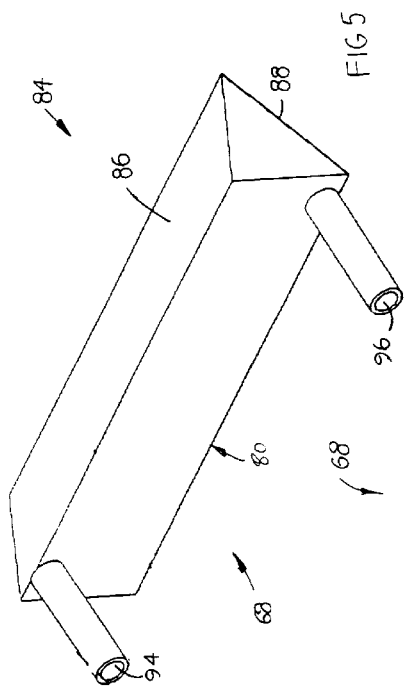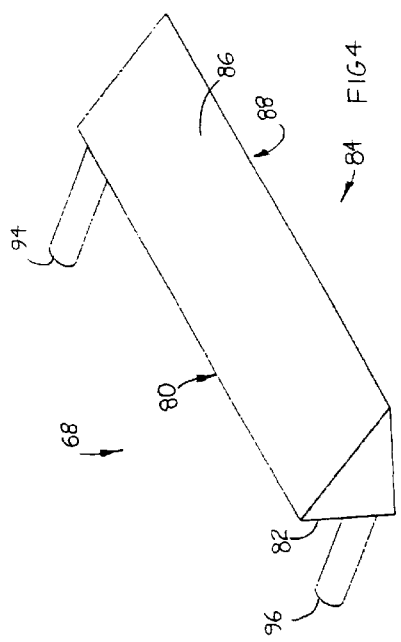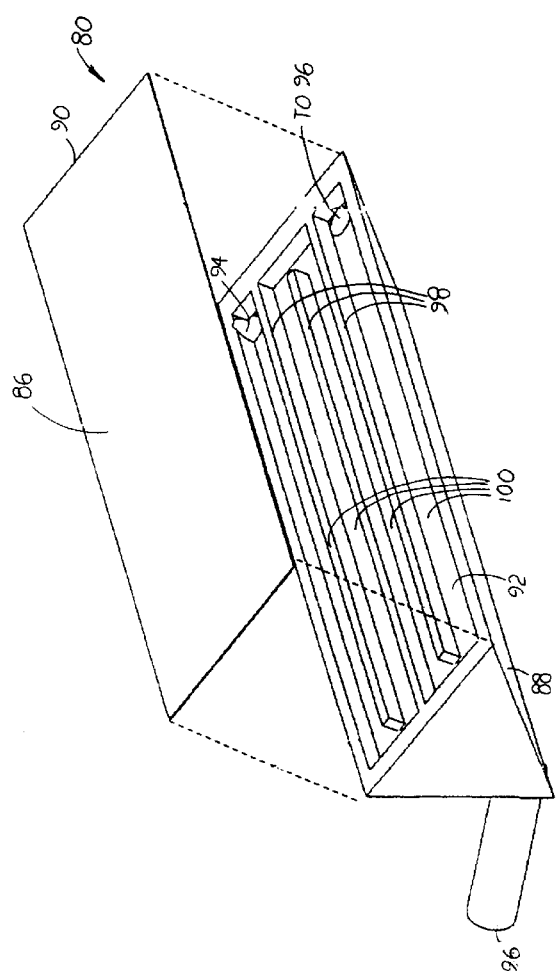

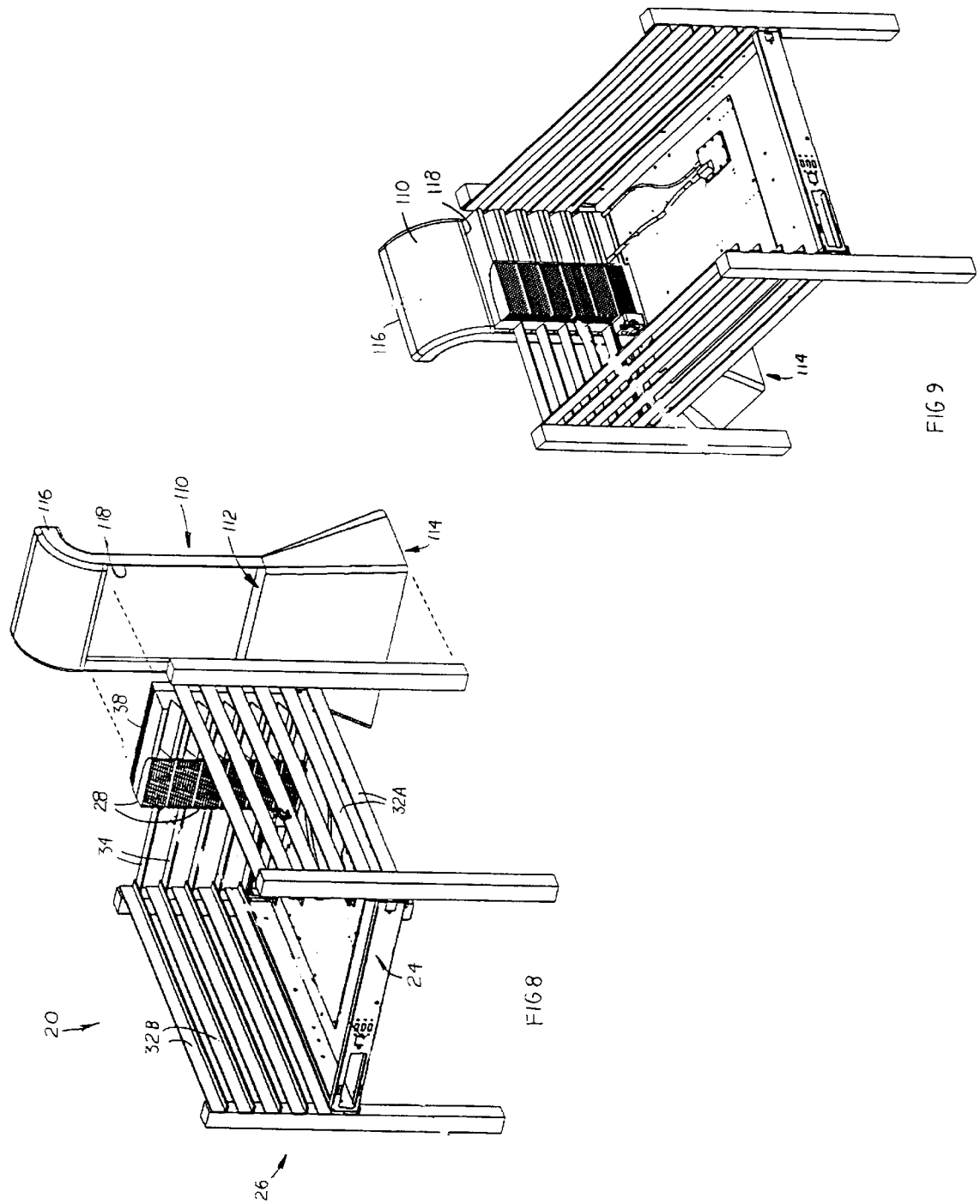

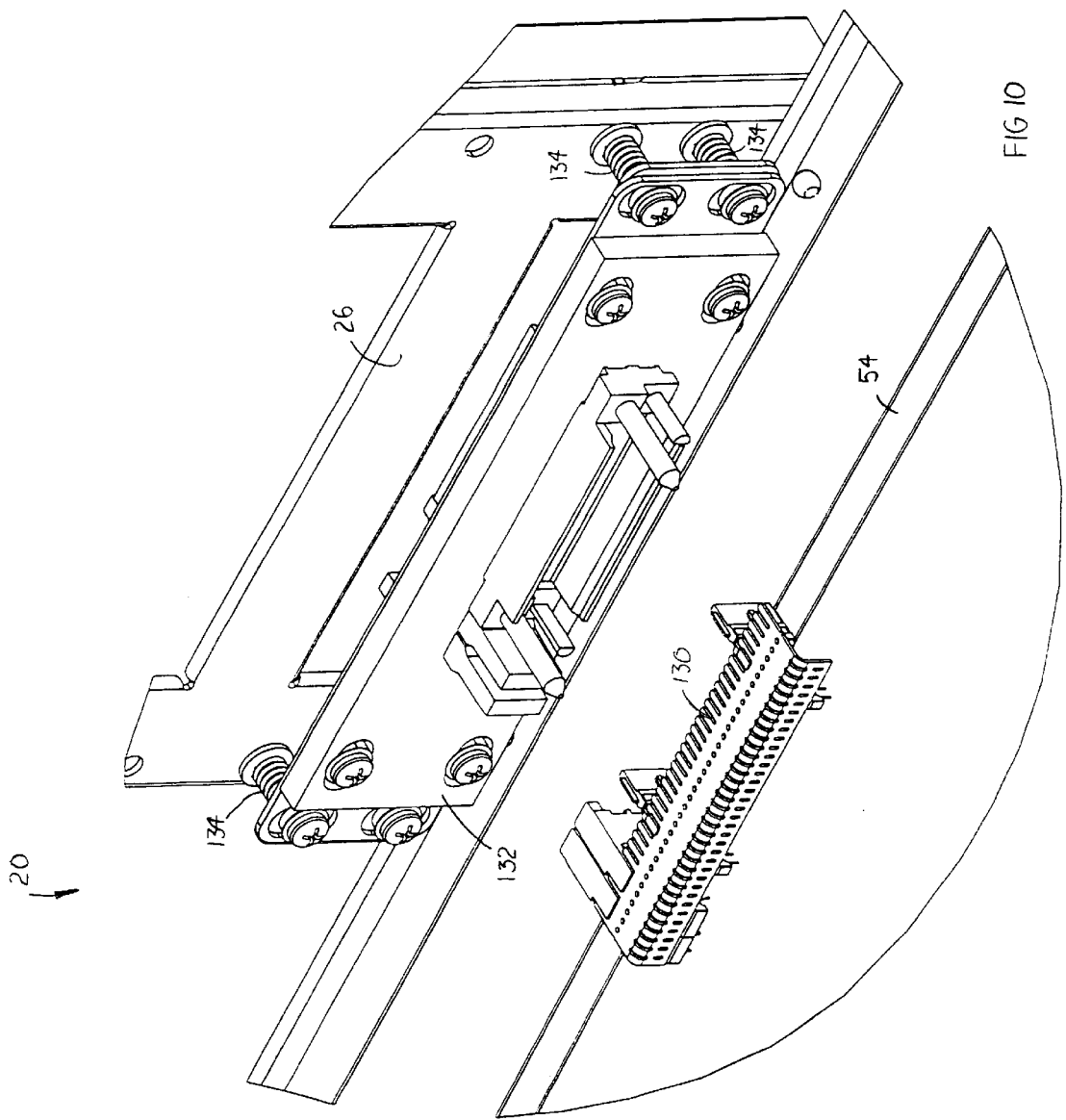

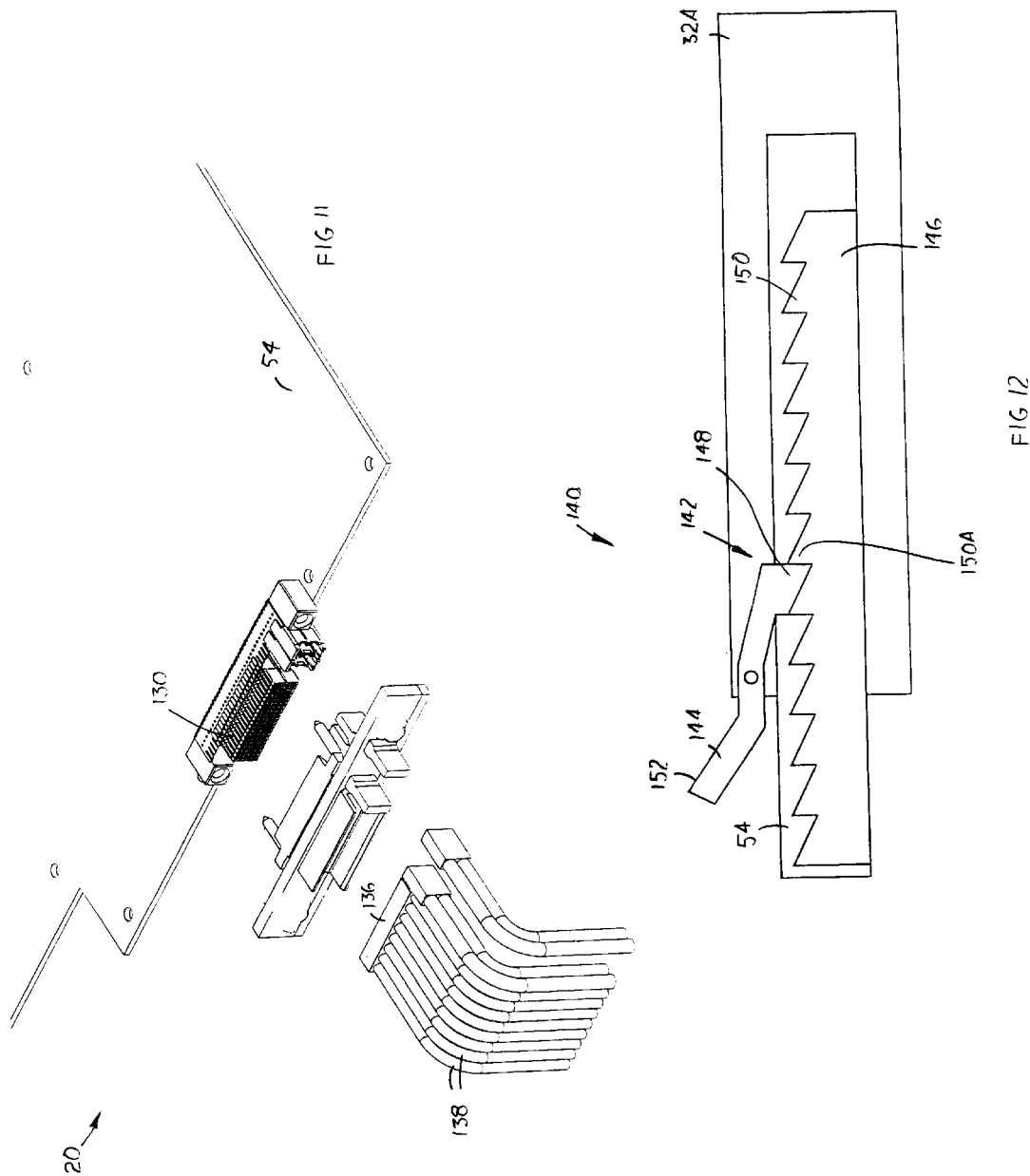

CHASSIS-LEVEL THERMAL INTERFACE COMPONENT FOR TRANSFER OF HEAT FROM AN ELECTRONIC COMPONENT OF A COMPUTER SYSTEM

BACKGROUND OF THE INVENTION

1). Field of the Invention

This invention relates to a computer system.

2). Discussion of Related Art

A server computer system usually includes a support frame and a plurality of server unit subassemblies that are insertable into the support frame. Each server unit subassembly has a processor which generates heat when being operated. The processor of each server unit subassembly usually generates a large amount of heat and removal of the heat may be problematic, especially if a large number of server unit subassemblies are located on the support frame in a compact arrangement.

BRIEF DESCRIPTION OF THE DRAWINGS

The invention is described by way of example with reference to the accompanying drawings, wherein:

FIG. 2 is a perspective view of a frame-level thermal interface component forming part of the embodiment of FIG. 1;

FIG. 3 is a cross-sectional side view of components of the server computer system of FIG. 1;

FIG. 4 is a perspective view from one side of a chassis-level thermal interface component forming part of the embodiment of FIG. 1;

FIG. 5 is a perspective view from another side of the chassis-level thermal interface component of FIG. 4;

FIG. 6 is an exploded perspective view of the chassis-level thermal interface component of FIG. 4;

FIG. 8 is a perspective view of the server computer system of FIG. 1, further illustrating an air duct thereof before mounting of the air duct;

FIG. 9 is a perspective view of the components shown in FIG. 8 after mounting of the air duct;

FIG. 10 is a perspective view of a floating support board and related components forming part of the server computer system of FIG. 1;

FIG. 11 is a perspective view from an opposing side of the components of FIG. 10;

FIG. 12 is a side view illustrating a ratchet mechanism forming part of the server computer system of FIG. 1;

DETAILED DESCRIPTION OF THE INVENTION

Throughout the following description, specific details are set forth in order to provide a more thorough understanding of the invention. However, the invention may be practiced without these particulars. In other instances, well-known elements have not been shown or described in detail to avoid unnecessarily obscuring the present invention.

Figure 1:
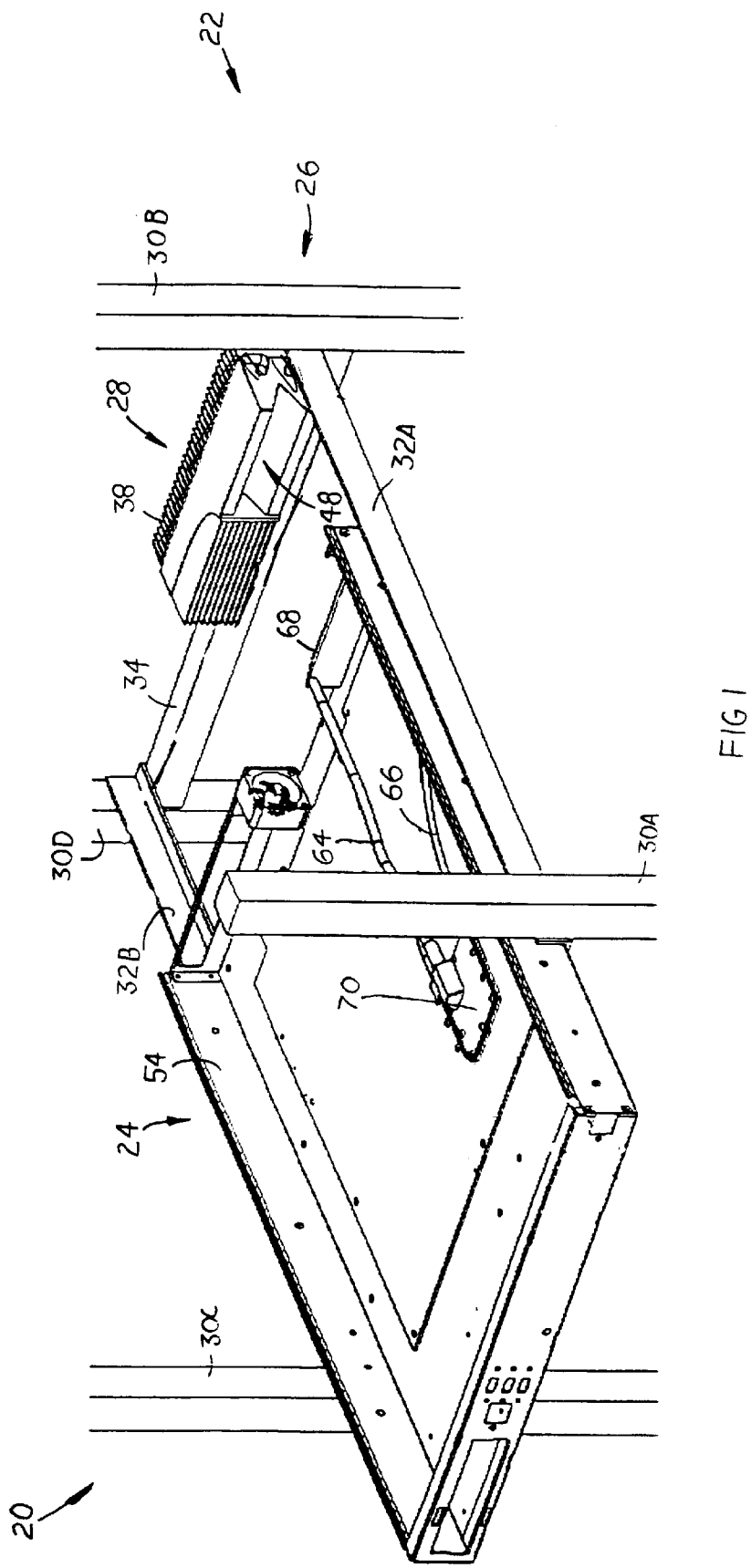
FIG. 1 is a perspective view of components of a server computer system, according to an embodiment of the invention.

FIG. 1 of the accompanying drawings illustrates a portion of a server computer system 20 according to an embodiment of the invention, including a portion of a server computer frame subassembly 22 and one server unit subassembly 24.

The server computer frame subassembly 22 includes a support frame 26 and a frame-level thermal interface component 28. The support frame 26 includes four vertically extending supports 30A–30D, two side rails 32A and 32B, and a rear structural member 34. One of the side rails 32A has a front end secured to a front right one of the vertically extending supports 30A, and a rear end secured to a rear right one of the vertically extending supports 30B. The other side rail 32B has a front end secured to a front left one of the vertically extending supports 30C, and a rear end secured to a rear left one of the vertically extending supports 30D. The side rails 32A and 32B extend parallel to one another from a front to a rear of the support frame 26. The rear structural member 34 has opposing ends secured to the right rear and the left rear ones of the vertically extending supports 30B and 30D, respectively.

FIG. 2 illustrates the frame-level thermal interface component 28 in more detail. The frame-level thermal interface component 28 includes a frame-level thermal interface subcomponent 36, a first set of fins 38, and a second set of fins 40.

The frame-level thermal interface subcomponent 36 has a width 42, a height 44, and a depth 46. The depth 46 is slightly more than the height 44, and the width 42 is approximately five times as much as the height 44.

An outer tapered recessed surface 48 is formed in a front of the frame-level thermal interface subcomponent 36. The recessed surface 48 has a lower portion 50 and an upper portion 52. The portions 50 and 52 are entirely straight, and are at an angle of approximately 30° relative to one another. The lower portion 50 is at an angle of approximately 55° relative to horizontal, and the upper portion 52 is at an angle of approximately 5° relative to horizontal. The recessed surface 48 has a constant cross-section along its width 42. Profiles of the recessed surface 48 at various vertical planes spaced horizontally along the width 42 are the same as the "V"-shape that can be seen at the end of the frame-level thermal interface subcomponent 36. The recessed surface 48 has height and a width, with the width being approximately three times as much as the height.

The profiled shape of the recessed surface 48 provides a larger surface area than a flat vertical surface having the same height. More heat can then be transferred through the recessed surface 48 than through a flat vertical surface. Such a feature is desirable because of the confined height allowed for individual server unit subassemblies on the support frame 26.

The fins 38 are all secured to a rear of the frame-level thermal interface subcomponent 36. The fins 38 extend parallel to one another from the frame-level thermal interface subcomponent 36. The fins 38 extend vertically parallel to one another along the frame-level thermal interface subcomponent 36. Air can thus easily flow between the fins 38 in a vertical direction.

The fins 40 are all secured to a front of the frame-level thermal interface subcomponent 36 to the left of the recessed surface 48. The fins 40 extend parallel to one another from a front of the frame-level thermal interface subcomponent 36. The fins 40 extend parallel to one another horizontally along the frame-level thermal interface subcomponent 36. Air can thus flow in a horizontal direction between the fins 40.

The entire frame-level thermal interface component 28 is made of copper because of the high thermal conductivity of copper. Other thermally conductive metals such as aluminum may provide adequate thermal conductivity in another embodiment. Heat can conduct through the portions 50 and 52 of the recessed surface 48 into the frame-level thermal interface subcomponent 36. The frame-level thermal interface subcomponent 36 is made entirely of metal and is typically molded or machined from a single piece of metal, so that the heat conducts therethrough to the fins 38. The heat can then convect from the fins 38 to air flowing between the fins 38.

Referring again to FIG. 1, the frame-level thermal interface component 28 is mounted on the rear structural member 34. The recessed surface 48 faces toward the front of the support frame 26, and the fins 38 extend from a rear of the support frame 26.

FIG. 3 illustrates the components of the server unit subassembly 24 in more detail. The server unit subassembly 24 includes a computer chassis 54, a circuit board 56, an electronic component in the form of a central processing unit processor 58, and a evaporator unit loop 60. The circuit board 56 is secured on a base of the computer chassis 54. The processor 58 is secured on the circuit board 56.

The evaporator unit loop 60 includes a evaporator unit 62, a hot vapor pipe 64, a cold liquid pipe 66, and a chassis-level thermal interface component 68.

The evaporator unit 62 includes a heat-absorbing evaporator block 70 and a capillary wicking material 72. The evaporator block 70 has an internal volume 74, an inlet 76 into the internal volume 74, and an outlet 78 out of the internal volume 74. The outlet 78 is at a higher elevation than the inlet 76.

A lower surface of the evaporator block 70 is located on the processor 58, and the evaporator block 70 is secured in such a position. The capillary wicking material 72 is located within the internal volume 74. The capillary wicking material 72 is not as high as the internal volume 74. A lower side of the capillary wicking material 72 is located on a lower internal surface of the internal volume 74. An upper side of the capillary wicking material 72 is located distant from an upper internal surface of the internal volume 74. A gap is thus defined between the upper side of the capillary wicking material 72 and the upper internal surface of the internal volume 74. The inlet 76 leads into the internal volume 74 at a location below the upper side of the capillary wicking material 72, and the outlet 78 leads out of the gap defined in an upper portion of the internal volume 74.

FIGS. 4 and 5 illustrate the chassis-level thermal interface component 68 in more detail. The chassis-level thermal interface component 68 includes a chassis-level thermal interface subcomponent 80. The chassis-level thermal interface subcomponent 80 has a front surface 82 and a tapered protruding rear surface 84. The rear surface 84 has upper and lower portions 86 and 88 respectively. The portions 86 and 88 are at an angle of approximately 30° relative to one another. The upper portion 86 is at an angle of approximately 5° relative to horizontal, and the lower portion 88 is at an angle of approximately 55° relative to horizontal. The shape of the rear surface 84 thus matches, and is complementary to, the shape of the recessed surface 48 in FIG. 3.

FIG. 6 illustrates the chassis-level thermal interface component 68 in exploded form. A wall 90 of the chassis-level thermal interface subcomponent 80 is removed. An internal volume 92 is defined inside the chassis-level thermal interface subcomponent 80. An upper portion of the wall 90 forms the upper portion 86 of the rear surface 84. A lower surface of the wall 90 defines one side of the internal volume 92.

An inlet 94 is formed into the internal volume 92, and an outlet 96 is formed out of the internal volume 92. A fluid can flow through the inlet 94 into the internal volume 92, and flow from the internal volume 92 out of the outlet 96. The fluid flows over the wall 90 while in the internal volume 92. Three baffles 98 are located in the internal volume 92. The baffles 98 divide the internal volume 92 into four chambers 100. The fluid flowing through the internal volume 92 flows sequentially through the chambers 100. The fluid is located against a respective portion of the wall 90 while located in each one of the chambers 100. The baffles 98 extend a fluid flow path through the internal volume, with a corresponding increase in effective heat-exchanging length, thereby increasing the rate of heat transfer.

Reference is again made to FIG. 3. Opposing ends of the hot vapor pipe 64 are connected respectively to the outlet 78 out of the evaporator block 70 and the inlet 94 into the chassis-level thermal interface subcomponent 80. Opposing ends of the cold liquid pipe 66 are connected respectively to the outlet 96 out of the chassis-level thermal interface subcomponent 80 and the inlet 76 into the evaporator block 70. The evaporator block 70 is located toward the front, and the chassis-level thermal interface component 68 is located toward the rear of the server unit subassembly 24. The rear surface 84 faces toward the rear of the server unit subassembly 24. A bracket 101 mounts rear ends of the pipes 64 and 66 in a relatively stationary position. The bracket 101 substantially disallows movement of the chassis-level thermal interface component 68 in a horizontal direction, while still allowing for a small amount of vertical movement of the chassis-level thermal interface component 68, relative to the computer chassis 54.

Reference is again made to FIG. 1. A rear of the computer chassis 54 is partially inserted into the front of the support frame 26. A right edge of the computer chassis 54 rests on the side rail 32A, and a left edge of the computer chassis 54 rests on the side rail 32B. The chassis-level thermal interface component 68 is located distant from the frame-level thermal interface component 28.

An operator slides the computer chassis 54 toward the rear of the support frame 26. Such movement of the computer chassis 54 moves the chassis-level thermal interface component 68 into engagement with the frame-level thermal interface component 28. The upper and lower portions 86 and 88 of the rear surface 84 shown in FIGS. 4 and 5 respectively make contact with the upper and lower surfaces 52 and 50 of the recessed surface 48 shown in FIG. 2.

Figure 7:
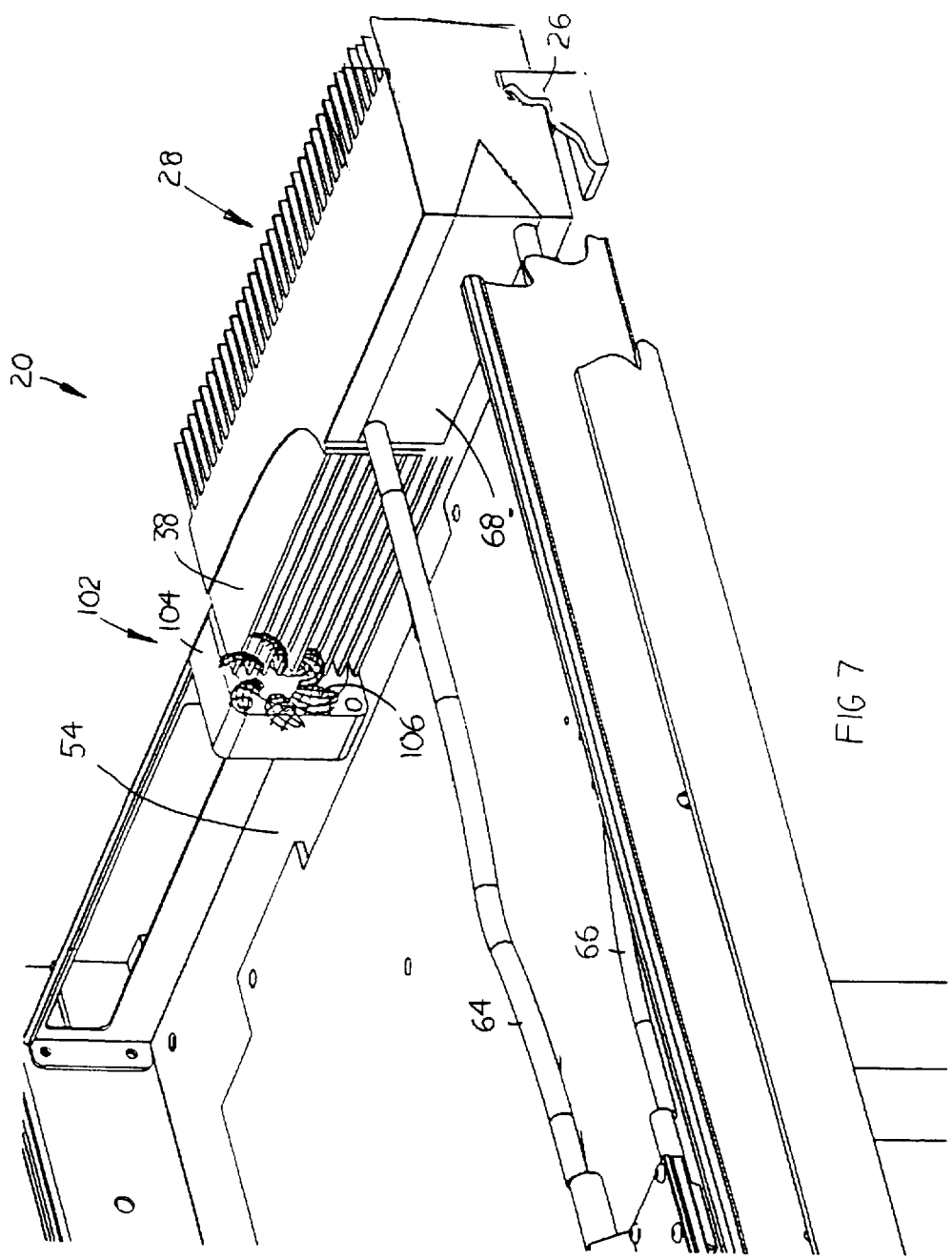
FIG. 7 is an enlarged perspective view of components of the embodiment of FIG. 1 after engagement of the chassis-level thermal interface component with the frame-level thermal interface component.

The angular profile of the rear surface 84 compensates for slight misalignment between the rear surface 84 and the recessed surface 48. The upper portion 86 may, for example, make contact with the upper portion 52 before the lower portion 88 makes contact with the lower portion 50. The chassis-level thermal interface component 68 is guided down along the upper portion 52 until the lower portions 84 and 50 contact one another, and the bracket 101 allows for such movement. FIG. 7 illustrates the server computer system 20 after full engagement of the chassis-level thermal interface component 68 with the frame-level thermal interface component 28.

In use, heat is generated by the processor 58 when operated. The processor 58 may, for example, generate at least 100 W of heat. Approximately 1 percent of the heat transfers to the circuit board 56. The other 99 percent of the heat conducts from the processor 58 through a lower wall of the evaporator block 70 into a liquid in the capillary wicking material 72. The heat evaporates the liquid, and a resulting vapor collects in the gap above the capillary wicking material 72. The vapor leaves the gap through the outlet 78 into the hot vapor pipe 64. More liquid flows through the inlet 76 into the capillary wicking material 72, replacing the vaporized fluid. A pump effect is thereby created, which circulates the fluid through the evaporator unit loop 60. The evaporator unit 62 thus has the advantage that it moves the fluid in a pump-like manner without the need for a pump having moving parts.

The vapor flows through the hot vapor pipe 64 to the chassis-level thermal interface component 68. Referring to FIG. 6, the vapor flows through the inlet 94 and then sequentially through the chambers 100 over the wall 90. The heat conducts from the vapor through the wall 90 to the portion 86. The vapor condenses while heat is being transferred therefrom, so that by the time that the vapor leaves the chambers 100 through the outlet 96, the vapor is transformed into a liquid. Heat is transferred in a similar manner from the vapor to the portion 88. Referring again to FIG. 3, the liquid returns through the cold liquid pipe 66 to the inlet 76 of the evaporator block 70.

Referring to FIG. 2, the heat conducts to the upper and lower portions 52 and 50 to the frame-level thermal interface subcomponent 36. The heat then conducts to the first set of fins 38. Substantially all of the heat generated by the processor 58 reaches the fins 38. Less than 2 percent of the heat transfers through the circuit board 56 and is lost through other mechanisms.

As shown in FIG. 7, the server computer system 20 further includes a fan assembly 102. The fan assembly 102 includes a fan housing 104 and a fan 106. The fan housing 104 is secured to the computer chassis 54. The fan 106 is secured to the fan housing 104, and is driven by an electric motor (not shown), so that the fan 106 may rotate. A rotation axis of the fan 106 extends from the left to the right of the computer chassis 54, so that the fan 106 directs air from the left to the right. The fan assembly 102 is moved into a position to the left of the fins 38 when the computer chassis 54 is inserted into the support frame 26. The fan 106 recirculates air within the chassis 54 and directs the air from the left to the right over the fins 38. The heat convects from the air flowing over the fins 38 to the fins 38. The heat then conducts from the fins 38 to the fins 40. The fins 40 thus receive heat from the air in the chassis 54 and from the processor 58.

FIG. 8 illustrates further components of the server computer system 20. The server computer system 20 includes a plurality of side rails 32A, a plurality of side rails 32B, a plurality of rear structural members 34, a plurality of frame-level thermal interface components 28, and an air duct 110. The side rails 32A are all located above one another. Similarly, the side rails 32B are all located above one another, and the rear structural members 34 are all located above one another. A plurality of server unit subassemblies 24 are insertable into the support frame 26. The server unit subassemblies 24 are separately insertable above one another, with respective right edges of the computer chassis thereof on respective ones of the right side rails 32A, and respective left edges of the computer chassis on respective ones of the left side rails 32B. The server unit subassemblies 24 may be identical to one another, and each may include a respective chassis-level thermal interface component 68.

Each frame-level thermal interface component 28 is secured to a respective one of the rear structural members 34. The frame-level thermal interface components 28 are located above one another. The fins 38 of all the frame-level thermal interface components 28 are vertically aligned with one another. Each server unit subassembly 24 has a respective chassis-level thermal interface component 68 that mates with a respective one of the frame-level thermal interface components 28. Heat thus transfers from a processor of each respective server unit subassembly 24 to the fins 38 of a respective frame-level thermal interface component 28.

The air duct 110 has an internal cavity 112, an air inlet 114 into the bottom of the internal cavity 112, and an air outlet 116 out of a top of the internal cavity 112. A thermal interface opening 118 is also formed in a front of the air duct 110.

Reference is now made to FIGS. 8 and 9 in combination. The thermal interface opening 118 is located over the fins of the frame-level thermal interface component 28. The thermal interface opening 118 has a rectangular opening which mates with a rectangular profile of the frame-level thermal interface components 28 located above one another.

The air outlet 116 is connected to a room-cooling duct (not shown). A negative pressure is created at the air outlet 116. Air at ambient temperature and pressure is drawn into the air inlet 114 and flows through the internal cavity 112 to the air outlet 116. Substantially all the air that is drawn in through the air inlet 114 leaves through the air outlet 116. A fan may be mounted in the air outlet 116 to draw air through the air duct 110.

The air flows vertically upward over the fins 38 while flowing through the internal cavity 112. The air flows sequentially over the fins 38 of one of the frame-level thermal interface components 28, and then over the fins 38 of another one of the frame-level thermal interface components 28 located above the previous frame-level thermal interface component 28. Because the fins 38 are all vertically aligned and the direction of flow of air is vertical, the air flows between the fins 38. Heat convects from the fins 38 to the air flowing over the fins 38, whereafter the air leaves via the air outlet 116 into an air duct of the room. It can thus be seen that an efficient manner is provided to cool the processors of all the server unit assemblies 24 by transferring heat to a common stream of air. The flow of the air is controlled so that the air does not again enter the room, which may require additional air conditioning.

Should any maintenance be required on any server unit subassembly 24, the server unit subassembly 24 is simply pulled out of the front of the support frame 26. The mating surfaces of the chassis-level thermal interface component 68 and the frame-level thermal interface component 28 simply separate. There are no screws or structures that provide a permanent connection between the thermal components of the server unit subassembly 24 and the thermal components of the server computer frame subassembly 22. There are thus no such fasteners or structures that have to be undone in order to remove the server unit subassembly 24 from the support frame 22 (with the exception of a ratchet mechanism, which is described below).

FIGS. 10 and 11 illustrate further components of the server computer system 20 that are used for taking up tolerances in the support frame 26. The server computer system 20 further includes a chassis-level connector 130, a support board 132, springs 134, a frame-level connector 136, and cables 138.

The chassis-level connector 130 is secured to the computer chassis 54. The chassis-level connector 130 is electrically connected to the circuit board 56 shown in FIG. 3. Electric signals can be transmitted between the chassis-level connector 130 and the processor 58 through the circuit board 56.

Each spring 134 has one end which is secured against the support frame 26, and an opposing end which is secured against the support board 132. The support board 132 is movably secured to the support frame 26 with the springs 134 between them. Movement of the support board 132 toward the support frame 26 compresses the springs 134. The springs 134 thereby create a force which tends to move the support board 132 away from the support frame 26. The magnitude of the force increases linearly with movement of the support board 132 toward the rear of the support frame 26.

The cables 138 are connected to the frame-level connector 136. The frame-level connector 136 is secured to the support board 132. The frame-level connector 136 moves together with the support board 132 relative to the support frame 26. Flexibility of the cables 138 allow for movement of the frame-level connector 136 relative to the support frame 26.

The chassis-level connector 130 engages and mates with the frame-level connector 136 when the computer chassis 54 is moved into the support frame 26. An insertion force between the frame-level connector 136 and the chassis-level connector 130 tends to move the chassis-level connector 130 into disengagement from the frame-level connector 136. The chassis-level connector 130 thus tends to move in a direction opposite to the direction in which the computer chassis 54 is inserted into the support frame 26.

Further movement of the computer chassis 54 into the support frame 26 also moves the support board 132 toward the support frame 26. Such movement or "float" of the support board 132 allows the computer chassis 54 to be inserted to a required depth into the support frame 26. Tolerances in assembly and manufacture of the support frame 26 are compensated for in this manner. The support board 132 also includes subcomponents that compensate for tolerances in the support frame 26 in three dimensions. Movement of the support board 132 compresses the springs 134, which creates a force which tends to move the support board 132 in a direction opposite to the direction in which the computer chassis 54 is inserted into the support frame 26. The springs 134 thus tend to move the computer chassis 54 out of the front of the support frame 26. The force created by the springs 134 is much larger than the insertion force between the frame-level connector 136 and the chassis-level connector 130, so that the force of the springs 134 only comes into play after the chassis-level connector 130 is fully mated with the frame-level connector 136. Compression of the springs is continued until the chassis-level interface component 68 mates with the frame-level thermal interface component 28.

FIG. 12 illustrates apparatus 140 of the server computer system 20, which is used for controlling the depth to which the computer chassis 54 is inserted into the support frame 26. The apparatus 140 includes a ratchet mechanism 142 and a disengaging lever 144.

The ratchet mechanism 142 includes a ratchet gear 146 and a ratchet pawl 148. The ratchet gear 146 is secured to the computer chassis 54. The ratchet gear 146 has a plurality of ratchet teeth 150. Each ratchet tooth 150 has a left surface which is substantially vertical, and a right surface which is at an angle relative to vertical.

The ratchet pawl 148 is pivotally secured to the side rail 32A. Clockwise movement of the ratchet pawl 148 moves the ratchet pawl 148 into a gap between two of the teeth 150. Counterclockwise movement of the ratchet pawl 148 moves the ratchet pawl 148 out of the gap. The ratchet pawl 148 is biased in a clockwise direction, or moves in a clockwise direction under gravity. The disengaging lever 144 is secured to the ratchet pawl 148 so as to move together with the ratchet pawl 148 either in a clockwise direction or in a counterclockwise direction. The disengaging lever 144 has a surface 152 which can be manually depressed. Depressing of the surface 152 rotates the disengaging lever 152 and the ratchet pawl 148 in a counterclockwise direction.

The computer chassis 54 moves from the left to the right along the side rail 32A when the computer chassis 54 is inserted into the support frame 26. The ratchet gear 146 moves together with the computer chassis 54 relative to the side rail 32A. The ratchet pawl 148 moves in a ratchet-like manner into successive gaps between subsequent ones of the teeth 150 when the computer chassis 54 is moved from left to right. Movement of the computer chassis 54 from right to left is, however, disallowed because the ratchet pawl 148 has a surface on the right which catches on a left surface of a respective selected tooth 150A. The ratchet pawl 148 and the selected tooth 150A thus prevent the computer chassis 54 from moving out of the support frame 26 under the force of the springs 134 and the insertion force between the chassis-level connector 130 and the frame-level connector 136.

The surface 152 is depressed should it be required to remove the computer chassis 54 out of the support frame 26. Depression of the surface 152 rotates the ratchet pawl 148 out of the gap between the selected tooth 150A and the tooth to the left thereof, so that the ratchet pawl 148 disengages from the selected tooth 150A. The springs 134 then bias the support board 132 and the computer chassis 54 in an opposite direction out of the support frame 26. The computer chassis 54 moves out of the support frame 26 under the forces of the springs 134. Such movement of the computer chassis 54 out of the support frame 26 disengages the chassis-level thermal interface component 68 from the frame-level thermal interface component 28. The momentum of the server unit subassembly 24 also disengages the chassis-level connector 130 from the frame-level connector 136.

Figure 13:
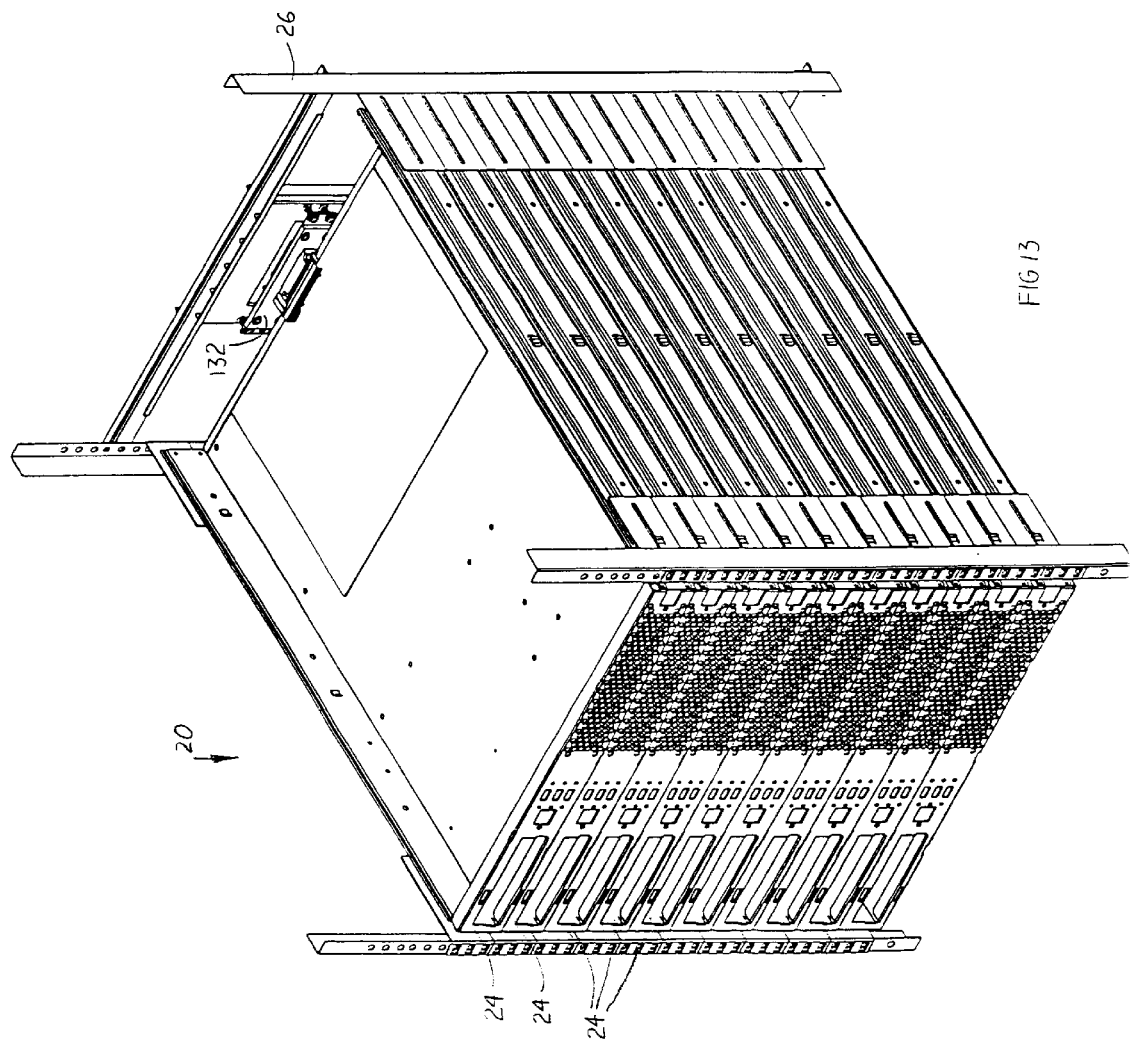
FIG. 13 is a perspective view of the server computer system of FIG. 1, further illustrating additional server unit subassemblies thereof.

FIG. 13 illustrates all the other server unit subassemblies 24 of the server computer system 20. The server unit subassemblies 24 are identical, and are inserted in rack form into the support frame 26. A plurality of support boards 32 is secured to the support frame, each next to a respective set of springs 134.

In the descriptions of the embodiments that follow, for purposes of efficacy, not all details thereof are described and discussed in detail. Instead, the description of each of the embodiments that follow primarily indicates differences between the specific embodiment described and an embodiment or embodiments that have been described previously. Unless specifically stated otherwise or unless it can be inferred, therefore, it can be assumed that the details of subsequent embodiments are the same as details of embodiments that have been described previously.

Figure 14:
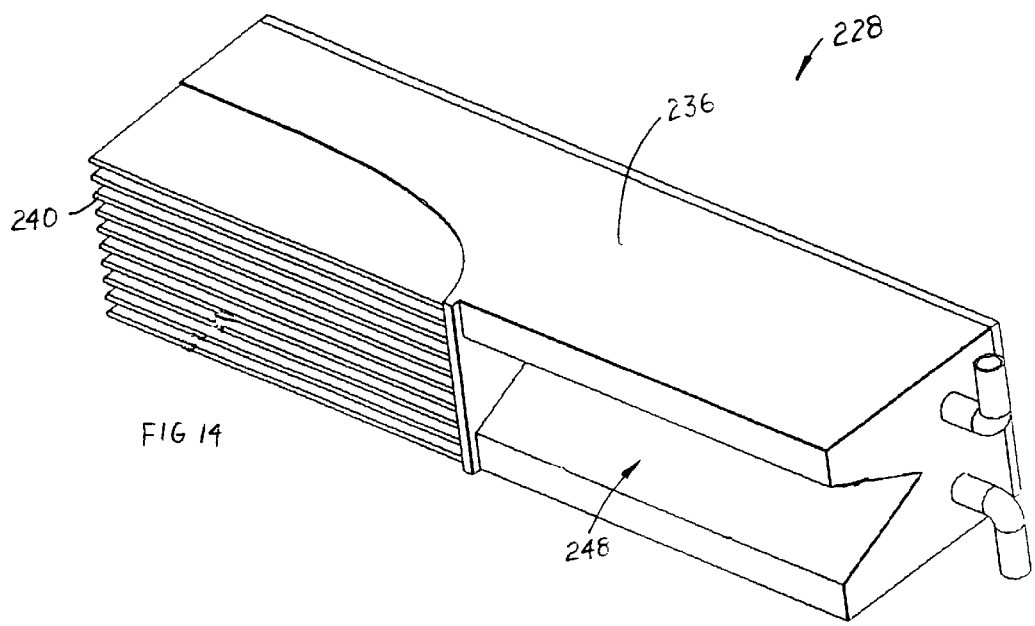
FIG. 14 is a perspective view of a frame-level thermal interface component according to another embodiment of the invention.
Figure 15:
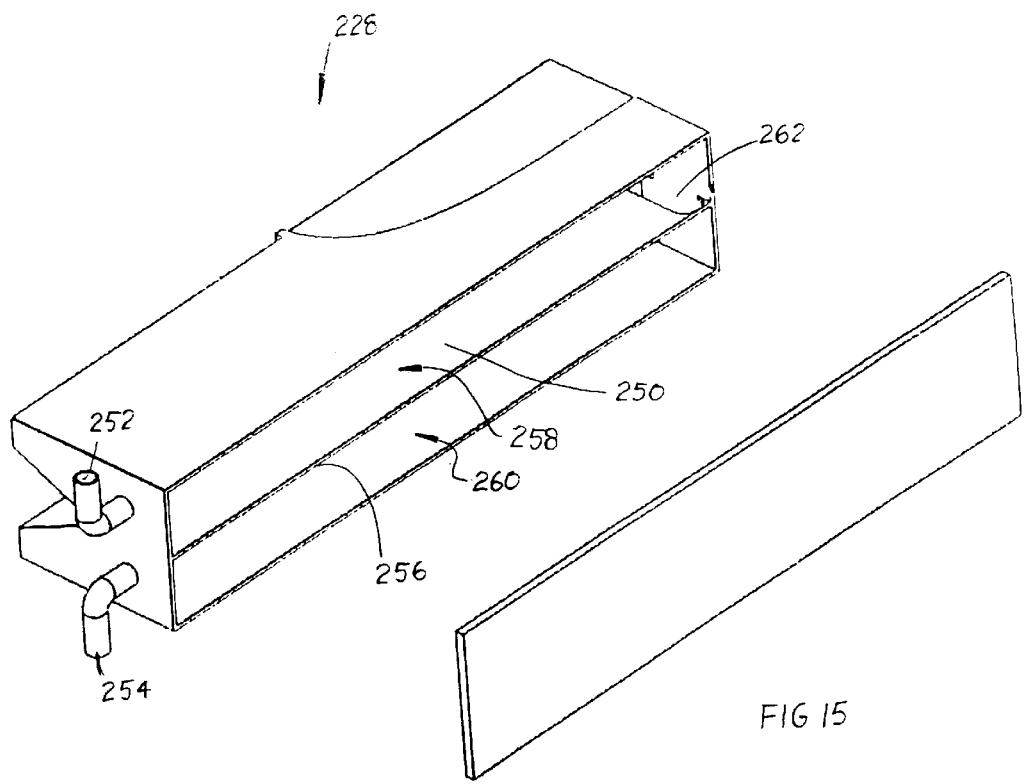
FIG. 15 is a perspective view from an opposing side of the frame-level thermal interface component of FIG. 14.

FIGS. 14 and 15 illustrate a frame-level thermal interface component 228 according to another embodiment of the invention. The frame-level thermal interface component 228 includes a frame-level thermal interface subcomponent 236 and a set of fins 240. The frame-level thermal interface subcomponent 236 has a recessed front surface 248 having the same profile as the recessed surface 48 of the frame-level thermal interface component 28 of FIG. 2.

The frame-level thermal interface subcomponent 236 has an internal volume 250, an inlet 252 into the internal volume 250, and an outlet 254 out of the internal volume 250. The frame-level thermal interface subcomponent 236 further has a baffle 256 in the internal volume 250. The baffle 256 divides the internal volume 250 into first and second chambers 258 and 260. A liquid circulation vent 262 connects the chamber 258 to the chamber 260. The inlet and the outlet 252 and 254 are located on the same side of the frame-level thermal interface subcomponent 236. The recessed surface 248 is an outer surface of a wall, and the wall also has an inner surface defining the internal volume 250. A liquid can enter through the inlet 252 and then flow sequentially through the chambers 258 and 260 before exiting through the outlet 254. Liquid flows over the wall while in the chamber 258 and in the chamber 260. Heat conducts from the surface 248 through the wall and then convects to the liquid while the liquid is in the chamber 258 and while the liquid is in the chamber 260. The baffle 256 extends a fluid flow path through the internal volume 250, with a corresponding increase in contact between the liquid and the surface 248, thereby increasing the rate with which heat convects to the fluid.

Figure 16:
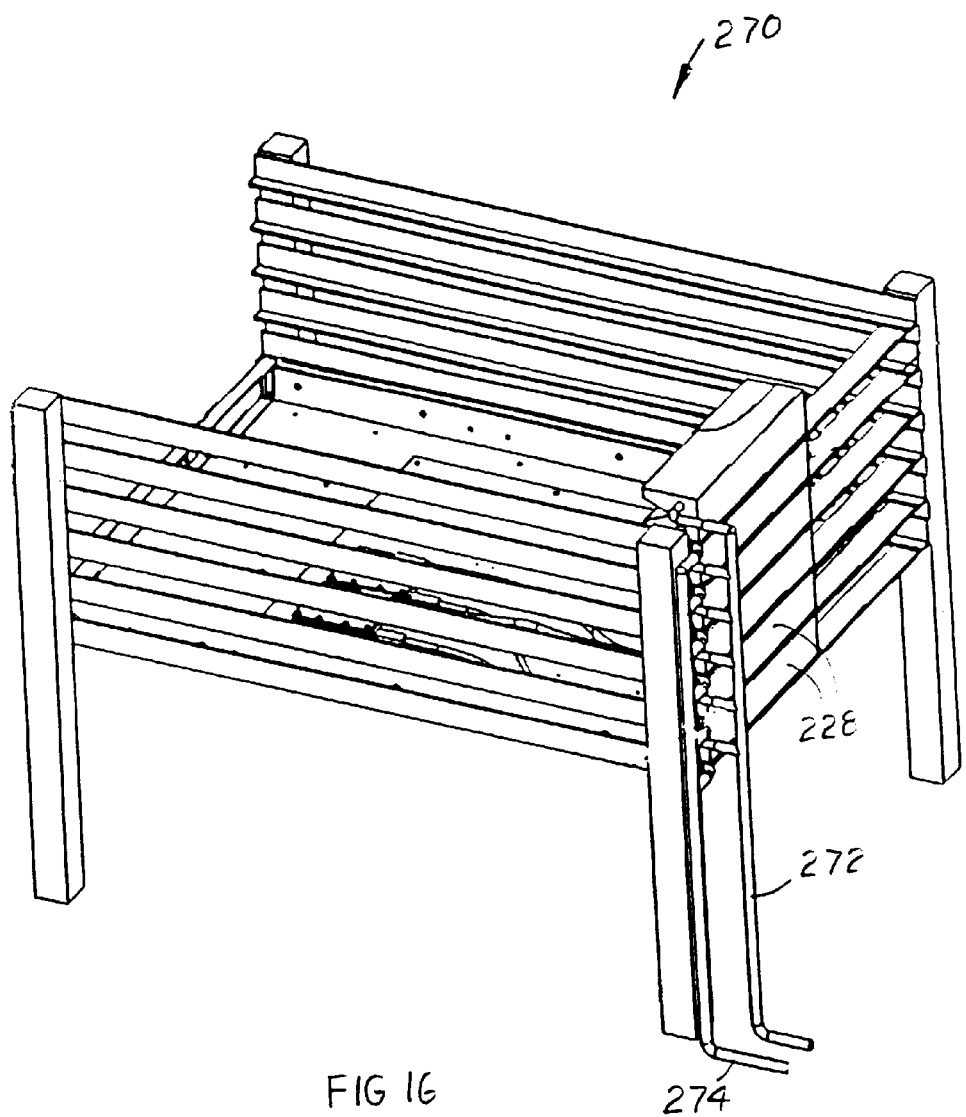
FIG. 16 is a perspective view of a further computer frame subassembly, with includes a plurality of the frame-level thermal interface components of FIG. 14, together with related inlet and outlet pipes for flow of liquid coolant.

FIG. 16 illustrates a server computer frame subassembly 270 of a server computer system according to another embodiment of the invention. The server computer frame subassembly 270 includes a plurality of frame-level thermal interface components 228 such as the frame-level thermal interface component of FIG. 14. When comparing FIG. 16 with FIG. 8, it will be seen that the frame-level thermal interface components 228 of FIG. 16 are instead of the frame-level thermal interface components 28 of FIG. 8. The server computer frame subassembly 270 further includes an inlet pipe 272 and outlet pipe 274. The inlets (252 in FIG. 15) of the respective frame-level thermal interface components 228 "T" out of the inlet pipe 272. The outlets (254 in FIG. 15) "T" into the outlet pipe 274.

In use, liquid coolant is introduced into a lower end of the inlet pipe 272. The liquid coolant flows from the inlet pipe 272 into the respective inlets of the respective frame-level thermal interface components 228. The liquid coolant flows in parallel through the respective frame-level thermal interface components 228, where it is heated. The liquid coolant then flows out of the outlets of the frame-level thermal interface components 228 to the outlet pipe 274. The liquid coolant may then be at a temperature of, for example, 25° C. The liquid coolant may be pre-processed to a temperature lower than ambient, e.g., 15° C., to increase the amount of heat that can be transferred in a given period of time.

The liquid coolant may also cool the fins 240 in FIG. 14. Heat can transfer from the internal volumes of computer chassis to the fins 240, and then from the fins 240 to the liquid coolant. If the coolant used is a liquid coolant, larger amounts of energy may be transferred thereto when compared to air, owing to, in most cases, the greater heat capacity of the liquid coolant.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A server unit subassembly, comprising:

a chassis insertable into a frame;

an electronic component on the chassis;

a chassis-level thermal interface component thermally coupled which includes a wall, the outer surface being an outer surface of the wall, an internal volume at least partially defined by the wall, an inlet into the internal volume, and an outlet out of the internal volume, a fluid circulating through the chassis-level thermal interface component thermally coupling the chassis-level thermal interface component to the electronic component so that heat generated by the electronic component transfers to the chassis-level thermal interface component, the outer surface positioned for mating with an outer surface of a frame component on the frame when the chassis is inserted into the frame, so that the heat can transfer from the chassis-level thermal interface component through the outer surfaces to the frame component.

2. The server unit subassembly of claim 1 wherein the outer surface of the chassis-level thermal interface component has first and second portions that are at an angle other than 0° relative to one another.

3. The server unit subassembly of claim 2 wherein the first and second portions are straight.

4. The server unit subassembly of claim 1 wherein the inlet is through a surface of the chassis-level thermal interface component other than the outer surface thereof that mates with the outer surface of the frame component.

5. The server unit subassembly of claim 1 wherein the chassis-level thermal interface component subcomponent has a baffle separating the internal volume into at least first and second chambers.

6. The server unit subassembly of claim 5 wherein a fluid flows sequentially through the inlet, the first chamber, the second chamber, and the outlet.

7. The server unit subassembly of claim 6 wherein the fluid flows over the internal surface wherein located in both the first and second chambers.

8. The server unit subassembly of claim 7 wherein the first and second chambers are both defined by a first portion of the internal surface, the first portion of the internal surface and the first portion of the outer surface directly opposing one another on opposite sides of the wall.

9. The server unit subassembly of claim 2 wherein the first and second portions are at an angle other than 90° relative to one another.

* * * * *

UNITED STATES PATENT AND TRADEMARK OFFICE
CERTIFICATE OF CORRECTION

| | |
|---|---|
| PATENT NO. | : 6,643,132 B2 |
| APPLICATION NO. | : 10/039003 |
| DATED | : November 4, 2003 |
| INVENTOR(S) | : Faneuf et al. |

It is certified that error appears in the above-identified patent and that said Letters Patent is hereby corrected as shown below:

In column 10, line 18 and 19, after "component", delete "thermally coupled".

Signed and Sealed this

Nineteenth Day of February, 2008

JON W. DUDAS
*Director of the United States Patent and Trademark Office*